United States Patent
Inukai et al.

(10) Patent No.: US 8,567,420 B2
(45) Date of Patent: Oct. 29, 2013

(54) CLEANING APPARATUS FOR SEMICONDUCTOR WAFER

(75) Inventors: Minako Inukai, Kawasaki (JP); Hiroshi Tomita, Yokohama (JP); Kaori Umezawa, Kamakura (JP); Yasuhito Yoshimizu, Yokohama (JP); Linan Ji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 656 days.

(21) Appl. No.: 12/412,638

(22) Filed: Mar. 27, 2009

(65) Prior Publication Data

US 2009/0255558 A1  Oct. 15, 2009

(30) Foreign Application Priority Data

Mar. 31, 2008 (JP) .................. 2008-92129
Mar. 31, 2008 (JP) .................. 2008-92149
Feb. 25, 2009 (JP) .................. 2009-42167

(51) Int. Cl.
*B08B 3/00* (2006.01)
*B08B 3/12* (2006.01)
*B08B 6/00* (2006.01)

(52) U.S. Cl.
USPC ....... 134/95.3; 134/94.1; 134/95.1; 134/95.2; 134/99.1; 134/102.1; 134/103.2; 134/137; 134/140; 134/144; 134/147; 134/148; 134/149; 134/151; 134/153; 134/157; 134/172; 134/180; 134/198; 134/199; 134/902

(58) Field of Classification Search
USPC ......... 134/137, 140, 144, 147, 148, 149, 151, 134/153, 157, 172, 180, 198, 199, 902, 134/94.1, 95.1, 95.2, 95.3, 99.1, 102.1, 134/103.2
See application file for complete search history.

(56) References Cited

U.S. PATENT DOCUMENTS

| | | | |
|---|---|---|---|
| 5,118,357 A * | 6/1992 | Sabatka ....................... 134/15 |
| 6,863,741 B2 * | 3/2005 | Orii et al. ..................... 134/30 |
| 6,901,938 B2 * | 6/2005 | Sato et al. .................... 134/99.1 |
| 7,004,181 B2 * | 2/2006 | Isago et al. ................. 134/102.1 |
| 2002/0005214 A1 * | 1/2002 | Tomita et al. ................. 134/36 |
| 2007/0223342 A1 | 9/2007 | Orii et al. |
| 2007/0261716 A1 * | 11/2007 | Franklin et al. ............... 134/33 |

FOREIGN PATENT DOCUMENTS

| | | |
|---|---|---|
| JP | 2000-107672 | 4/2000 |
| JP | 2000-117201 | 4/2000 |
| JP | 2000117201 A * | 4/2000 |

(Continued)

OTHER PUBLICATIONS

JP 2000-117201 Machine Translation Apr. 2000 Japan HARA.*

(Continued)

*Primary Examiner* — Michael Barr
*Assistant Examiner* — Charles W Kling
(74) *Attorney, Agent, or Firm* — Finnegan, Henderson, Farabow, Garrett & Dunner, L.L.P.

(57) ABSTRACT

A cleaning apparatus for a semiconductor wafer includes: a gas jet device including a gas nozzle which jets a first gas onto the surface of a semiconductor wafer to thin the thickness of a stagnant layer on the surface of the semiconductor wafer; and a two-fluid jet device including a two-fluid nozzle which jets droplet mist onto a region where thickness of the stagnant layer of the semiconductor wafer is thinned, the droplet mist being mixed two-fluid of a liquid and a second gas.

20 Claims, 18 Drawing Sheets

(56) References Cited

FOREIGN PATENT DOCUMENTS

| JP | 2004-335671 | 11/2004 |
|---|---|---|
| JP | 2005-5469 | 1/2005 |
| JP | 2008-71875 | 3/2008 |

OTHER PUBLICATIONS

JP 2000-117201 English Translation Apr. 2000 Japan HARA.*
Notification of Reasons for Rejection issued by the Japanese Patent Office on Jul. 2, 2010, for Japanese Patent Application No. 2008-092129, and English-language translation thereof.
Notification of Reason for Rejection, mailed Aug. 21, 2012, from the Japanese Patent Office regarding corresponding Japanese Patent Application No. 2009-042167, and English translation thereof (8 pages).
Notification of Reason for Rejection, mailed Mar. 15, 2013, from the Japanese Patent Office regarding corresponding Japanese Patent Application No. 2009-042167, and English translation thereof (10 pages total).

* cited by examiner with cleaning liquid comprising: making a surface of the semiconductor wafer as water-repellent so that a stagnant layer of the cleaning liquid is not formed on the surface of the semiconductor wafer; and thereafter, cleaning the surface of the semiconductor wafer with the cleaning liquid.

CLEANING APPARATUS FOR SEMICONDUCTOR WAFER

CROSS REFERENCE TO RELATED APPLICATIONS

This application is based upon and claims the benefit of priority from the prior Japanese Patent Application No. 2008-92129, filed on Mar. 31, 2008, No. 2008-92149, filed on Mar. 31, 2008, and No. 2009-42167, filed on Feb. 25, 2009, the entire contents of which are incorporated herein by reference.

BACKGROUND OF THE INVENTION

1. Field of the Invention

The present invention relates to a cleaning apparatus for a semiconductor wafer, and a cleaning method for a semiconductor wafer.

2. Related Art

According as device pattern is being thinned by development of the semiconductor manufacturing technology, there is desired a cleaning technology capable of removing particles as finer pollutant material from a semiconductor wafer.

Hitherto, a two-fluid jet cleaning apparatus as a single wafer cleaning apparatus is constituted as described below. Namely, droplet (droplet mist) in which gas such as dry air or nitrogen, etc. and liquid such as deionized water, etc. are mixed so that they are misted is jetted onto the surface of a rotating semiconductor wafer. Along with this jet operation, scanning is performed from the central part of the semiconductor wafer in a direction of the outer peripheral part. Thus, particles on the semiconductor wafer are removed and cleaned.

Moreover, there is also known a technology in which such two-fluid jet cleaning apparatus is applied to remove particles by the lift-off action by using APM (mixed liquid of ammonia, hydrogen peroxide water and water, etc.) (see Japanese Patent Laid-Open No. 2004-335671).

However, in the case where particles attached on the semiconductor wafer surface is fine even with the above-described two-fluid jet cleaning apparatus, it was difficult to remove such fine particles (e.g., particle having height not more than 70 nm).

SUMMARY OF THE INVENTION

In accordance with one embodiment of the present invention, there is provided a cleaning apparatus for a semiconductor wafer including: a gas jet device including a gas nozzle which jets a first gas onto the surface of a semiconductor wafer to thin the thickness of a stagnant layer on the surface of the semiconductor wafer; and a two-fluid jet device including a two-fluid nozzle which jets droplet mist onto a region where thickness of the stagnant layer of the semiconductor wafer is thinned, the droplet mist being mixed two-fluid of a liquid and a second gas.

Moreover, in accordance with another embodiment of the present invention, there is provided a cleaning method for a semiconductor wafer with cleaning liquid comprising: thinning thickness of a stagnant layer of the cleaning liquid on the surface of the semiconductor wafer than thickness of a stagnant layer of water by using the cleaning liquid having a surface tension lower than that of water and having viscosity lower than that of water; and cleaning the semiconductor wafer with the cleaning liquid.

In addition, in accordance with a further embodiment of the present invention, there is provided a cleaning method for a

DETAILED DESCRIPTION OF THE INVENTION

Prior to description of the embodiment of the present invention, the inventors will describe how to realize this invention.

The inventors conducted various experiments in order to analyze the phenomenon such that fine particles cannot be removed even with the two-fluid jet cleaning apparatus described in the Related Art to analyze the experiment result thereof.

The inventors have paid attention to the fact that the surface of semiconductor is wet also after such a semiconductor wafer is wetted by water to rotate such a semiconductor wafer to spray droplets on the surface thereof by centrifugal force. The result of the experiment relating thereto will now be described.

Figure 1:
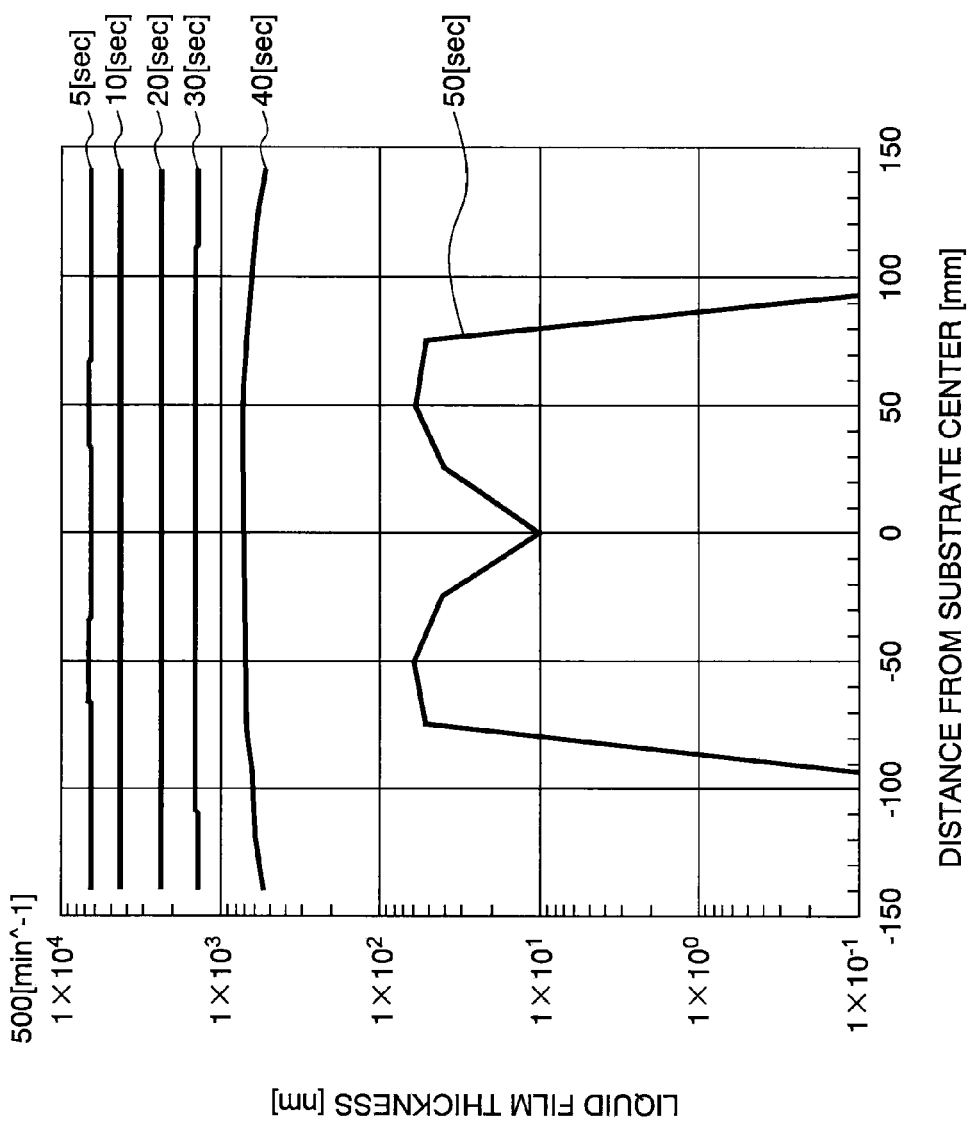
FIG. 1 is a measurement diagram of film thickness of water on a semiconductor wafer.

A semiconductor wafer wetted by water is rotated to measure the film thickness of water on the semiconductor wafer. FIG. 1 shows the relationship of elapsed time, film thickness of water on the semiconductor wafer and distance from the center of the semiconductor wafer in the case where the semiconductor wafer is rotated at rotational speed of 500 rpm. The abscissa of FIG. 1 indicates distance (mm) from the center of the semiconductor wafer, and the ordinate indicates film thickness (nm) of water. The film thickness of water was determined by utilizing interference of light. In FIG. 1, the time since supply of water is stopped is described. Namely, water on a wafer is drained from the wafer by rotation after supply of water is stopped. In FIG. 1, changes of film thicknesses of water after 5 sec., 10 sec., 20 sec., 30 sec., 40 sec., and 50 sec. are passed are illustrated as graphical representation.

In FIG. 1, explanation will be given by taking an example of film thickness at the position of about 50 mm from the center of a semiconductor wafer. In the case where difference of measurement result at the above-mentioned position (film thickness of water which is removed or separated every 10 sec.) is described, when the remaining film at the time of 20 sec. is subtracted from the remaining film at the time of 10 sec., water of about 1500 nm/10 sec. is drained. Further, when the remaining film at the time of 30 sec. is subtracted from the remaining film thickness at the time of 20 sec., water of about 1100 nm/10 sec. is drained. When the remaining film at the time of 40 sec. is subtracted from the remaining film at the time of 30 sec., water of about 700 nm/10 sec. is drained. When the remaining film at the time of 50 sec. is subtracted from the remaining film at the time of 40 sec. as final difference, water of about 640 nm/10 sec. is drained. From this result, it is said that water on a wafer is drained until the first 30 sec. at a high speed larger than about 1 μm/10 sec., and speed of water removed from the wafer for 20 sec. subsequent thereto is dried at dry speed of 600 to 700 nm/10 sec. From this fact, it is said that there results dry condition where a large amount of water are drained from the wafer for several ten sec. from immediately after shift to dry step after supply of water is stopped, and discharge speed becomes slow at the latter half of dry process. From this phenomenon, it is said that the first step is rotational discharge dry step of liquid in which dynamic flow of liquid (water flow layer: layer of water freely flowing by centrifugal force, etc.) is main. At the latter half step, it is said that since discharge speed is lowered, there results evaporation dry step in which evaporation dry step from the surface in which dynamic discharge is not expected is main. From the result obtained from FIG. 1, it is considered that since droplet sprayed toward the outside of a semiconductor wafer is not observed at the time when thickness becomes equal to about 70 nm or less which is obtained from the last interference fringe, water flow does not already exist so that most of film layer is so-called wet layer (stagnant layer) of the semiconductor wafer surface. Such wet layer can practically only be removed by vaporization. Namely, it was found out that layer of water having thickness of about 70 nm or less (wet layer: stagnant layer) in which the dynamic movement by, e.g., centrifugal force or droplet shape change at the time of two-fluid cleaning, etc. cannot be taken in is left on the semiconductor wafer. In this specification, such water layer will be referred to as stagnant layer.

It is to be noted that the above-mentioned result also depends upon dry process condition (the rate of rotations, acceleration), kind of underlying film and three-dimensional shape.

Namely, it has been found out that stagnant layer having thickness of 70 nm or less always exists on a wet semiconductor wafer.

That is, the inventors have confirmed that there exists water layer serving as stagnant layer which does not flow even by centrifugal force. The inventors peculiarly have attained the finding that cleaning of the semiconductor wafer by water flow flowing on the upper surface of the stagnant layer is carried out in a manner as described below.

Figure 2A:
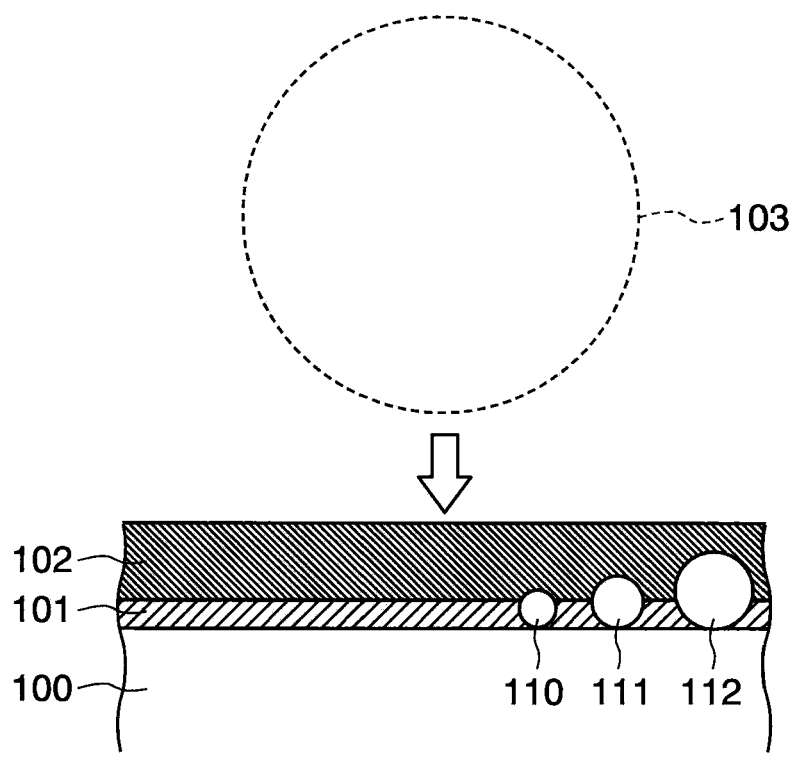
FIG. 2A is a model diagram indicating the state immediately before a droplet collides.
Figure 2B:
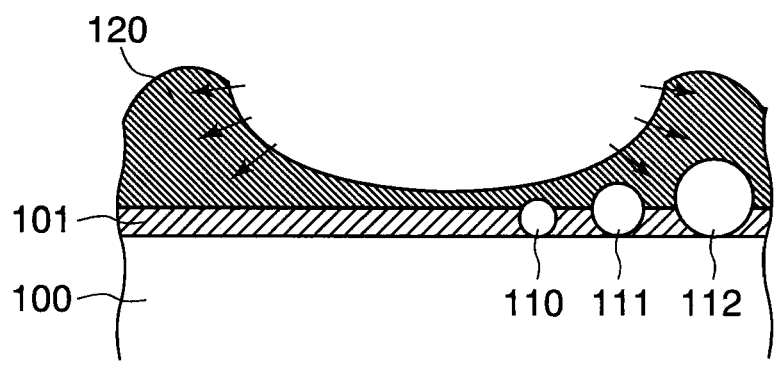
FIG. 2B is a model diagram indicating the state immediately after a droplet has collided.

It is assumed that large, medium and small three particles 110 to 112 shown in FIGS. 2A and 2B exist on a semiconductor wafer 100. The cleaning process by two-fluid jet of the semiconductor wafer 100 in this case will be described. Namely, FIGS. 2A and 2B represent, in a model form, the state where force is applied to particles 110 to 112 by droplet 103 included in droplet mist jetted toward the surface of the semiconductor wafer 100 by using the two-fluid jet cleaning apparatus. FIG. 2A represents the state immediately before a droplet 103 collides, and FIG. 2B represents the state immediately after the droplet 103 has collided.

As shown in FIG. 2A, particles 110 to 112 having different sizes and stagnant layer 101 are attached on the surface of the semiconductor wafer 100. Moreover, a water flow layer 102 flowing in a surface direction exists above the stagnant layer 101. These particles 110 to 112 are placed in the state where the lower portion thereof is partially embedded within the stagnant layer 101.

Here, it is assumed that, as an example, the height (diameter) of the particle 110 is about 90 nm, the height of the particle 111 is about 140 nm, the height of the particle 112 is about 180 nm, the thickness of the stagnant layer 101 is about 70 nm, the thickness of the water flow layer 102 is about 5 μm and the radius of droplet 103 is about 20 μm.

It should be noted that the size of droplet 103 is represented in a contracted form as compared to the stagnant layer 101, etc. for clarifying explanation.

Next, as shown in FIG. 2B, when droplet 103 included in droplet mist collides with water flow layer 102 on the surface of the semiconductor wafer 100, the droplet 103 and the water flow layer 102 thereof are mixed and deformed so that there results a droplet collision fluid layer 120. In this specification, the water flow layer 102 deformed by collision of the droplet 103 will be referred to as droplet collision fluid layer 120.

By collision, plural waves concentrically spreading toward outer circumferential direction of the semiconductor wafer 100 take place at the droplet collision fluid layer 120. Force of these waves is applied to particles 111, 112. Thus, particles 111, 112 having medium diameter and large diameter are separated from the surface of the semiconductor wafer 100. As a result, these particles 111 and 112 are removed.

However, the particle 110 having small diameter of which greater part is embedded within the stagnant layer 101 cannot effectively undergo force of the droplet collision fluid layer 120. Accordingly, this particle cannot be removed.

Figure 3:
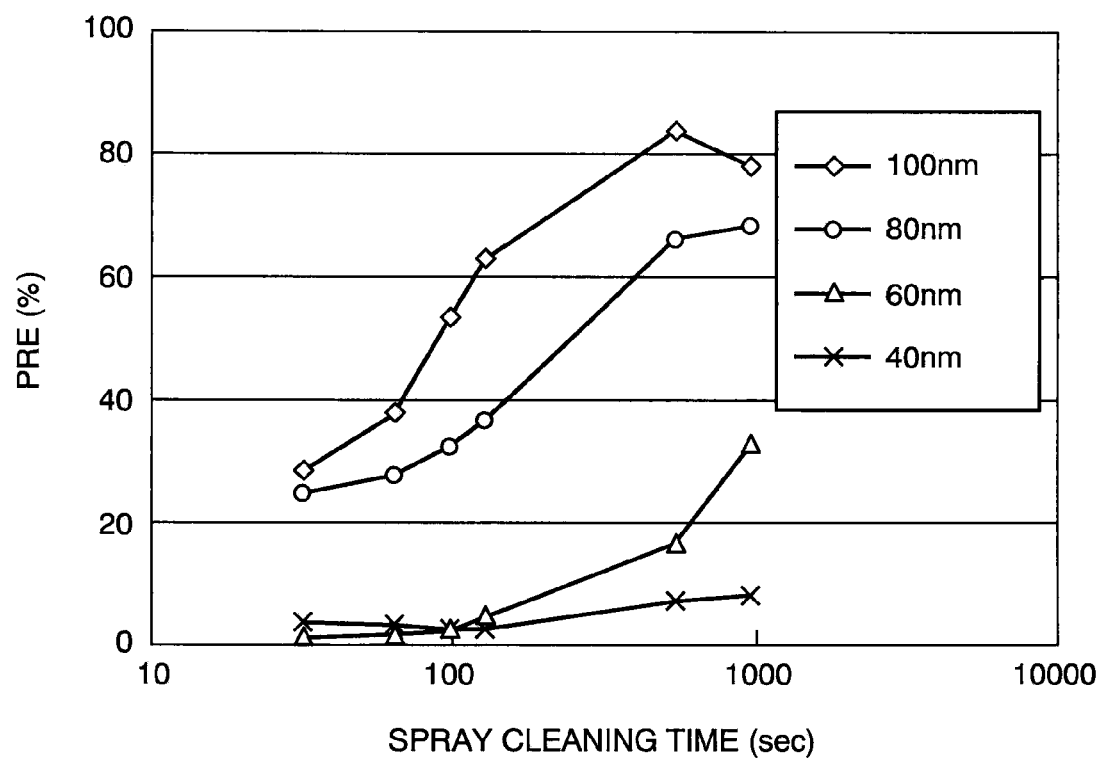
FIG. 3 is a diagram showing particle removal efficiency by two-fluid jet cleaning using deionized water.

Namely, the inventors peculiarly have attained the following matter. It has been found that it is impossible to remove fine particles embedded within the stagnant layer 101 and having height not more than film thickness (e.g., not more than about 70 nm) of the stagnant layer 101 by existence of the stagnant layer 101. In concrete terms, it has become clear as shown in FIG. 3 that there is fine particle diameter dependency in Particle Removal Efficiency (PRE) in the case of two-fluid jet cleaning using ordinary deionized water (DIW), and removal of fine particle having a height of 60 nm or less is difficult. In addition, in the case of PSL (Polystyrene Latex) particle, it has been found out that according as the particle diameter becomes smaller, the particle removal efficiency is deteriorated to more degree.

The inventors have made this invention on the basis of the above-described peculiar findings.

The embodiments of the present invention will now be described with reference to the attached drawings. These embodiments do not limit the present invention.

In the embodiments described below, a fundamental principle is that the previously described stagnant layer 101 is thinned, or completely removed to physically apply force to particles exposed therefrom to remove them.

First, in the first to fourth embodiments, attention is drawn to the property of the cleaning liquid and wettability of the surface of the semiconductor wafer 100 to thin the stagnant layer 101, or to completely remove such layer.

It is to be noted that pattern having uneven portions is formed on the surface of that semiconductor wafer subject to cleaning process.

First Embodiment

The first embodiment of the present invention will be described with reference to FIGS. 4 to 6.

In this embodiment, chemical liquid having surface tension lower than that of water and viscosity lower than that of water such as alcohol based liquid or fluoric based liquid is used as cleaning liquid in the cleaning processing using single wafer cleaning apparatus in place of water. For example, cleaning is carried out by using isopropyl alcohol (IPA) as alcohol based chemical liquid, or hydrofluoroether (HFE) as fluoric based chemical liquid. In this case, it is preferable that concentration of the chemical liquid is high.

Figure 4:
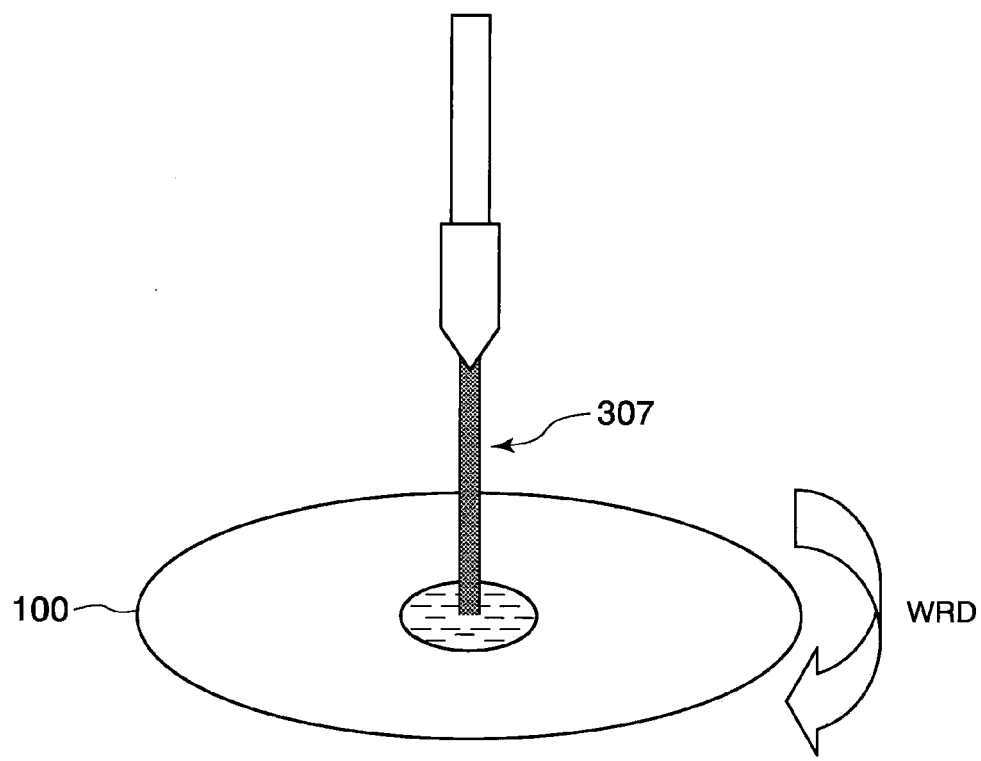
FIG. 4 is a conceptual diagram of a two-fluid jet cleaning apparatus according to a first embodiment of the present invention.
Figure 5:
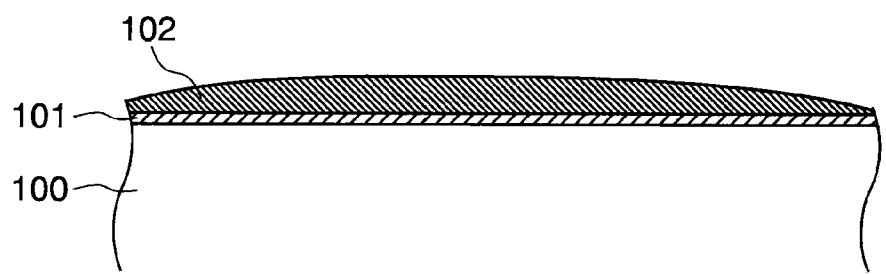
FIG. 5 is a model diagram showing the surface state of a semiconductor wafer according to the first embodiment of the present invention.

Explanation will be given with respect to the example where two-fluid jet cleaning apparatus shown in FIG. 4 is used as the single wafer cleaning apparatus. In this case, droplet mist 307 in which two-fluid of the cleaning liquid and gas are mixed is jetted toward the surface of the semiconductor wafer 100. WRD indicates wafer rotation direction. Since surface tension and viscosity of cleaning liquid are lower than those of water, the film thicknesses of the stagnant layer 101 and water flow layer 102 of cleaning liquid which are necessarily formed on the semiconductor wafer 100 as shown in FIG. 5 become thinner than the film thickness in the case where water is used. Thus, the droplet 103 included in droplet mist 307 can become close to the surface of the semiconductor wafer 100. Accordingly, fine particle (height not more than 70 nm) embedded within the stagnant layer 101 in the case where water is used is exposed from the thinned stagnant layer 101. Under such state, droplet collision fluid layer takes place by droplet 103 which has arrived at the surface of the semiconductor wafer 100. Thus, particles are efficiently removed by force of wave that droplet collision fluid layer has as has been described with reference to FIGS. 2A and 2B.

Figure 6:
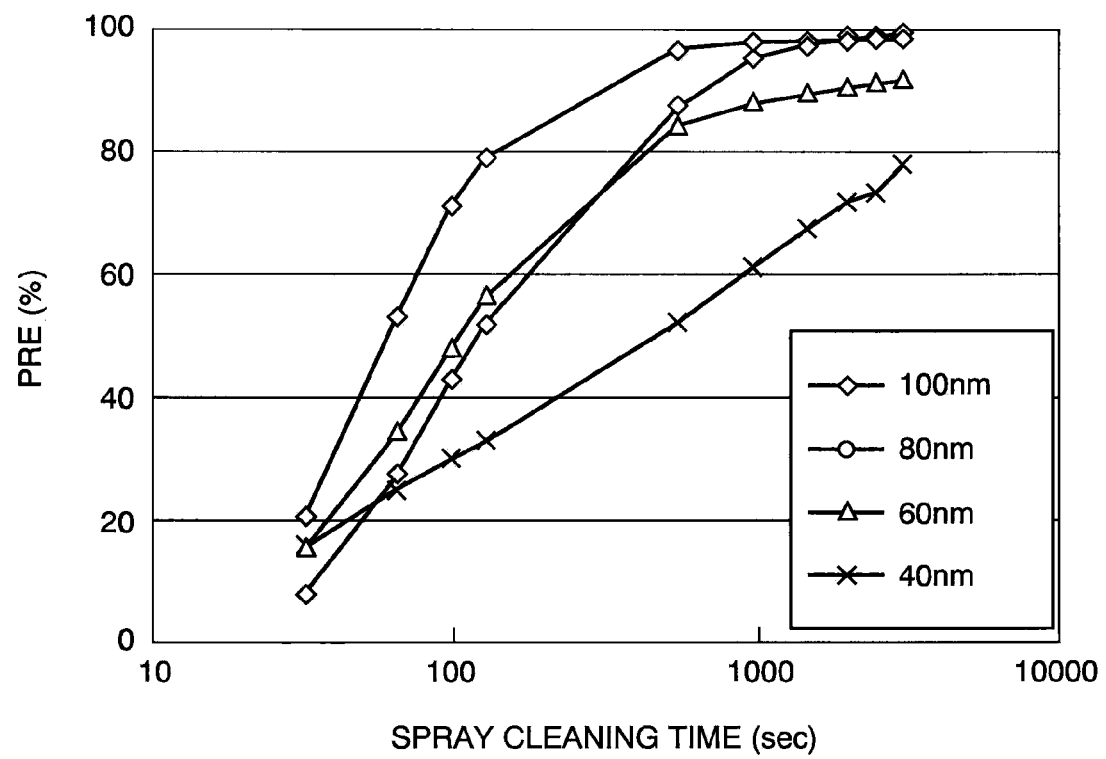
FIG. 6 is a diagram showing particle removal efficiency by two-fluid jet cleaning using dilute IPA aqueous solution according to the first embodiment of the present invention.

As an example of this embodiment, FIG. 6 shows particle removal efficiency by two-fluid jet cleaning using dilute IPA aqueous solution (IPA dilute DIW). As shown in FIG. 6, it becomes clear that particle removal efficiency of particle not more than 60 nm is improved as compared to the two-fluid jet cleaning using deionized water shown in FIG. 3.

In accordance with this embodiment, even in the case where wettability of the surface of the semiconductor wafer 100 is high, since surface tension of cleaning liquid is low, it is possible to make an improvement such that the thickness of the stagnant layer 101 of the cleaning liquid becomes thin.

Moreover, in accordance with this embodiment, since cleaning liquid having low surface tension is used as described above, the cleaning liquid is apt to be entered into corner portions of pattern having uneven portions. As a result, it is possible to carry out cleaning of particles existing thereat.

In addition, in the case where cleaning is carried out by using, e.g., water as a modified example of the first embodiment, cleaning liquid in which surface active agent which permits the surface of the semiconductor wafer 100 to be hydrophobic is mixed into water is used. Thus, surface tension of cleaning liquid can be lowered. Accordingly, the stagnant layer 101 becomes thin. As a result, it is possible to effectively remove fine particles.

Second Embodiment

The second embodiment of the present invention will now be described with reference to FIG. 7. This embodiment relates to a cleaning method in which cleaning liquid having high surface tension (e.g., water, etc.) and a semiconductor wafer having low wettability (water repellency property) surface are combined. In this specification, the property for repelling cleaning liquid is referred to as water repellency.

Figure 7:
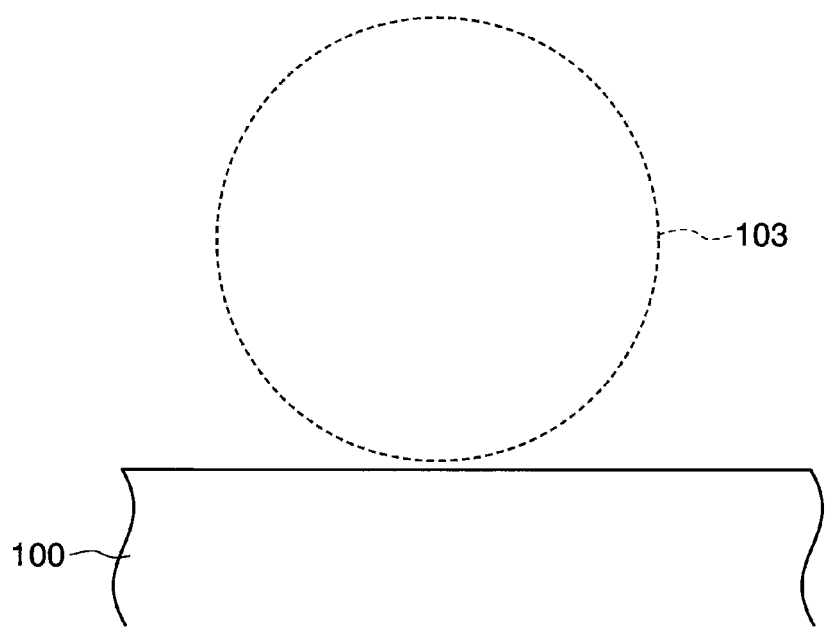
FIG. 7 is a model diagram showing the surface state of a semiconductor wafer according to a second embodiment of the present invention.

In accordance with this embodiment, stagnant layer 101 of cleaning liquid is not formed on the surface of a semiconductor wafer 100 having low wettability (water repellency) as shown in FIG. 7. Thus, there is no possibility that fine particles on the semiconductor wafer 100 are embedded within the stagnant layer 101. Accordingly, it is possible to effectively remove fine particles by force produced as the result of the fact that cleaning liquid having high surface tension flows within the surface of the semiconductor wafer 100.

Third Embodiment

The third embodiment of the present invention will now be described with reference to FIG. 8. This embodiment differs from the first embodiment in that semiconductor wafer having low wettability (water repellency) is used.

Namely, this embodiment relates to a cleaning method in which cleaning liquid having surface tension lower than that of water, and a semiconductor wafer having surface of low wettability (water repellency) are combined.

Figure 8:
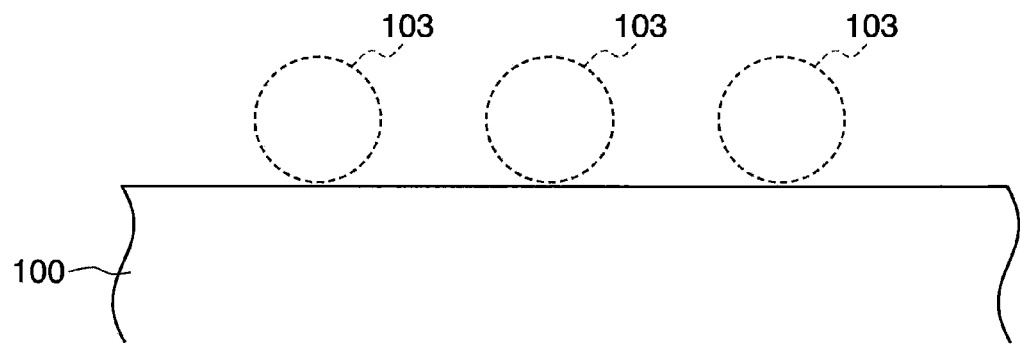
FIG. 8 is a model diagram showing the surface state of a semiconductor wafer according to a third embodiment of the present invention.

In accordance with this embodiment, stagnant layer 101 of cleaning liquid is not formed on the surface of a semiconductor wafer 100 having low wettability (water repellency) as shown in FIG. 8. Accordingly, it is possible to effectively remove fine particles on a semiconductor wafer 100 in a manner similar to the second embodiment.

Fourth Embodiment

Figure 9:
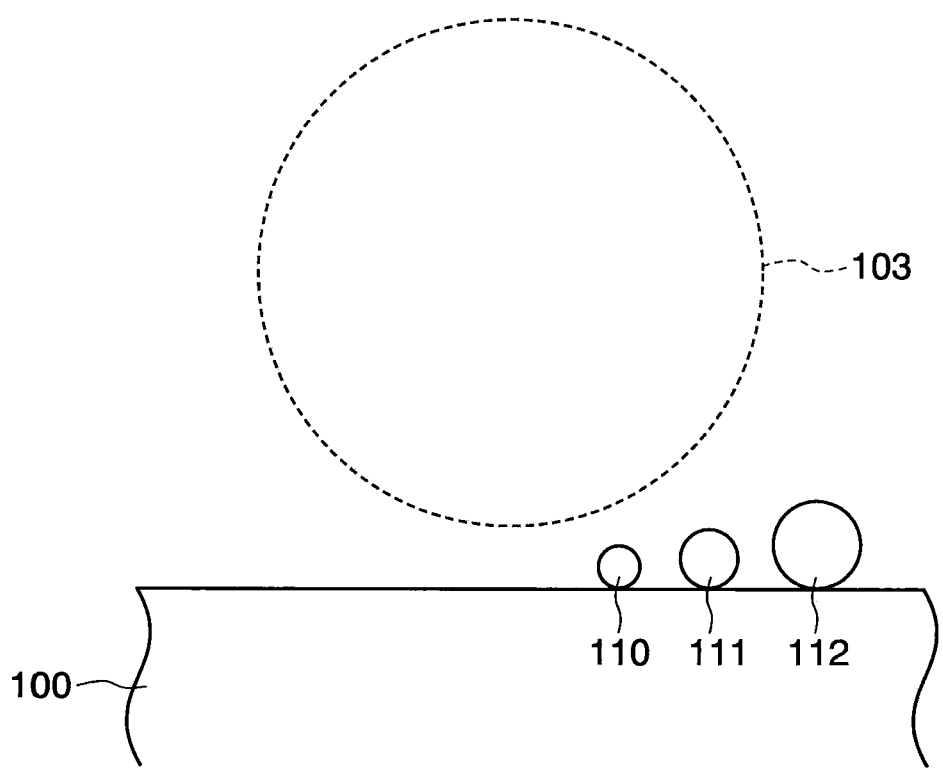
FIG. 9 is a model diagram showing the surface state of a semiconductor wafer according to a fourth embodiment of the present invention.

The fourth embodiment of the present invention will now be described with reference to FIG. 9. This embodiment differs from the first embodiment in that, in performing cleaning processing by using single wafer cleaning apparatus, water repellency processing liquid which permits the semiconductor wafer 100 to be water-repellent is used.

Namely, e.g., silicon resin coating agent is used as water repellency processing liquid, thereby allowing, in advance, the semiconductor wafer 100 to be placed in high water-repellent state. In concrete terms, the surface of the semiconductor wafer is converted into the surface having high water repellency by using silane coupling agent such as hexamethyl disilazan (HMDS) or tetramethylsilyl diethylamine (TMS-DMA), etc. As shown in FIG. 9, since the surface of the semiconductor wafer 100 caused to be in water-repellent state is not wetted by water, stagnant layer 101 is not formed. Accordingly, it is also possible to supply water onto the surface of rotating a semiconductor wafer 100 to remove particles 110 to 112 only by centrifugal force.

Moreover, in the case where two-fluid jet cleaning apparatus is used as single wafer cleaning apparatus, the semiconductor wafer itself is first caused to have high water repellency so that water having high pressure used for cleaning is not entered into gaps of fine pattern. Accordingly, it is possible to reduce damage applied to fine pattern from lateral direction.

In this case, particles hardly exist gaps of fine pattern. Most of them exist at broad pattern portion.

Moreover, in accordance with this embodiment, the surface including particles is caused to be water-repellent as monolayer (single molecular layer). In this case, particle has the structure and is large as compared to fine pattern. For this reason, those particles physically undergo force by droplet so that such particles are removed.

In addition, it is preferable that after particles are removed, ashing processing is carried out to remove water repellency coating film.

Then, a method of thinning the previously described stagnant layer 101 on the basis of point of view different from the above-described embodiments to carry out cleaning processing will be described. In the following embodiments, a fundamental principle is that stagnant layer 101 is thinned by pressure of gas to physically apply force to particles exposed therefrom to remove them.

In the following embodiments, the surface of the semiconductor wafer 100 is assumed to be hydrophilic.

Fifth Embodiment

The fifth embodiment of the present invention will be described with reference to FIGS. 10 to 12.

Figure 10:
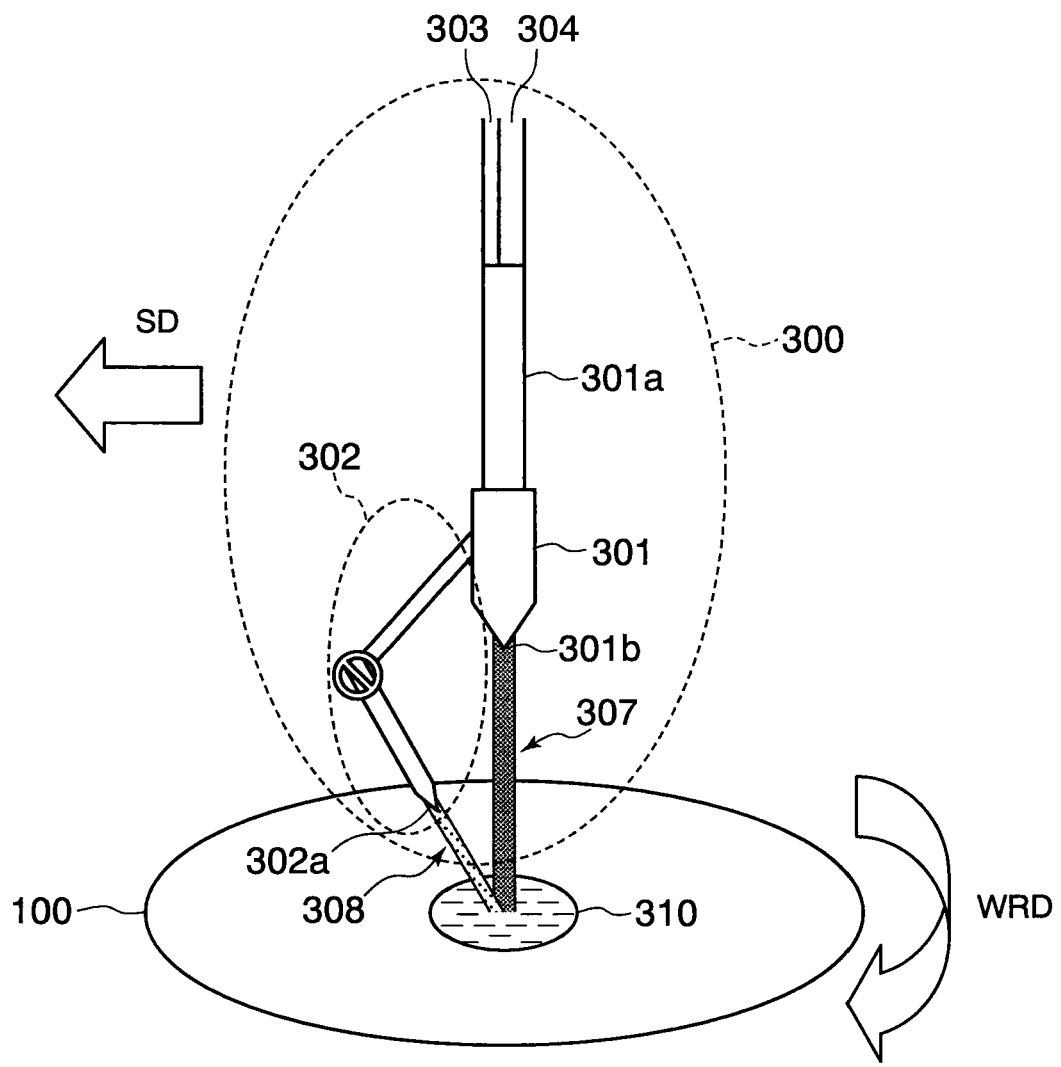
FIG. 10 is a conceptual diagram schematically representing the main part of a cleaning apparatus for a semiconductor wafer according to a fifth embodiment of the present invention.

FIG. 10 is a conceptual diagram schematically indicating the main part of a cleaning apparatus for a semiconductor wafer according to this embodiment. As shown in FIG. 10, the cleaning apparatus for a semiconductor wafer includes a three-fluid jet nozzle 300 including a two-fluid jet nozzle 301, and a gas jet nozzle 302.

The two-fluid jet nozzle 301 serves to jet droplet mist 307 from a jet hole 301b of the front end, which is produced as the result of the fact that two-fluid of liquid (e.g., deionized water, etc.) and gas (second gas; e.g., dry air or nitrogen, etc.) are mixed, in a manner substantially perpendicular to the surface of the semiconductor wafer 100. Moreover, the gas jet nozzle 302 serves to jet gas 308 (first gas; e.g. dry air or inactive gas such as nitrogen, etc.) with a certain angle relative to vertical direction with respect to the surface of the semiconductor wafer 100.

Since this cleaning apparatus uses, in addition to two-fluid, a fluid different therefrom, such cleaning apparatus is referred to as three-fluid jet cleaning apparatus in this specification.

A gas inlet 303 to which gas 308 is supplied is provided at the upper part of the three-fluid jet nozzle 300. The gas inlet 303 is configured to communicate with jet hole 302a of the gas jet nozzle 302 through gas passage penetrated through the internal part of a conduit 301a. Moreover, an inlet 304 for respectively separately supplying gas and liquid into the two-fluid jet nozzle 301 is also provided at the upper part of the three-fluid jet nozzle 300. This inlet 304 is also configured to communicate with jet hole 301b of the two-fluid jet nozzle 301 through the gas passage and the liquid passage which are penetrated through the internal part of the conduit 301a which is separated from the gas passage through which gas 308 is passed.

The cross sectional structure of the front end part of the two-fluid jet nozzle 301 will now be described with reference to FIG. 11.

Figure 11:
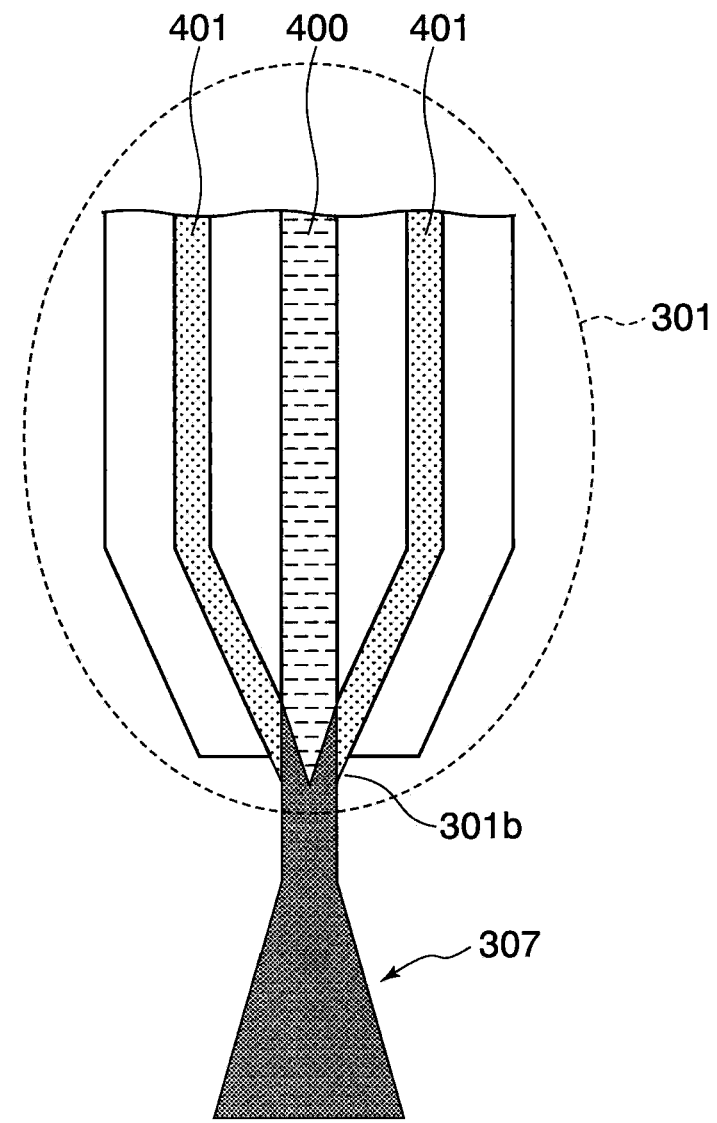
FIG. 11 is a cross sectional diagram of a two-fluid jet nozzle according to the fifth embodiment of the present invention.
Figure 12:
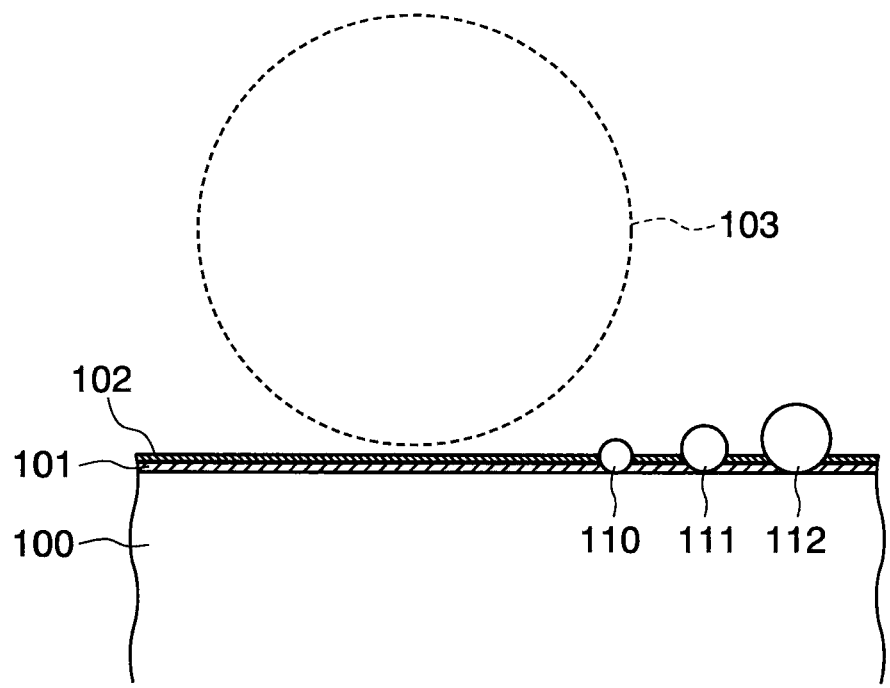
FIG. 12 is a model diagram showing the surface state of a semiconductor wafer according to the fifth embodiment of the present invention.

As shown in FIG. 11, the two-fluid jet nozzle 301 includes a liquid passage 400 at the central part thereof, and includes a gas passage 401 in such a manner to concentrically surround the liquid passage 400. Liquid supplied from the inlet 304 is passed through the liquid passage 400 of the inside, and gas is passed through the gas passage 401. Thus, the liquid and the gas are jetted as mixed droplet mist 307 from the jet hole 301b of the front end of the two-fluid jet nozzle 301. As a result, the liquid and the gas result in droplet mist 307 more effectively mixed on the downstream side relative to the mixed point of liquid and gas. It is to be noted that there may be employed a configuration in which liquid is delivered to the outside, and gas is delivered to the inside.

The operation of the cleaning apparatus for a semiconductor wafer according to this embodiment will now be described in detail.

First, stage (not shown) horizontally holds a semiconductor wafer 100, and rotates the semiconductor wafer 100 around the vertical axis passing through the center of the semiconductor wafer 100. The rate of rotations is, e.g., 300 to 500 rpm.

Subsequently, gas 308 is jetted from the jet hole 302a of the front end of the gas jet nozzle 302, and droplet mist 307 is jetted from the jet hole 301b of the front end of the two-fluid jet nozzle 301. It is preferable that jet speed of gas 308 is higher than jet speed of droplet mist 307. The jet speed of the droplet mist 307 is, e.g., 20 to 50 m/sec. Moreover, jet speed of gas 308 is, e.g., 150 to 300 m/sec. Further, the region of the surface of the semiconductor wafer 100 at which gas 308 arrives is the region at which droplet mist 307 arrives.

In this example, region 310 wetted by droplet mist 307 is formed on the surface of the semiconductor wafer 100.

Here, the surface state in the case where jet of the above-described gas 308 is carried out in advance with respect to the semiconductor wafer 100 where stagnant layer 101 exists on the surface thereof, and droplet mist 307 is jetted thereafter will be described with reference to FIG. 12. In FIG. 12, since respective components are the same as those of FIGS. 2A, 2B, the same reference numerals are respectively attached to the same components, and the description thereof will be omitted.

When gas 308 is jetted onto the stagnant layer 101, its thickness is thinned by pressure of gas 308. Namely, as shown in FIG. 12, the stagnant layer 101 becomes thinner than that of FIGS. 2A, 2B, and fine particles 110 to 112 are exposed toward the outside of the stagnant layer 101 further as compared to those of FIGS. 2A, 2B.

In this case, the thickness of the stagnant layer 101 remaining on the surface of the semiconductor wafer 100 depends upon jet speed (pressure) of gas 308. For example, when jet speed of gas 308 is further increased, the thickness of the stagnant layer 101 becomes thinner.

Subsequently, droplet collision fluid layer takes place (not shown) by droplet 103 which has arrived at the surface of the semiconductor wafer 100 under the state where particles 110 to 112 are exposed from the stagnant layer 101 in this way. As described by making reference to FIGS. 2A and 2B, particles 110 to 112 are efficiently removed by force of wave that the droplet collision fluid layer has.

On the other hand, when the droplet collision fluid layer loses kinetic energy, moisture which has formed the droplet collision fluid layer becomes integral with the stagnant layer 101. Accordingly, the stagnant layer 101 becomes thick again. However, the stagnant layer 101 is thinned again by continuously jetted gas 308 for a time period until next droplet 103 arrives.

Namely, for a time period during which gas 308 is jetted, the stagnant layer 101 is always maintained thin. Accordingly, the droplet 103 can become close to the semiconductor wafer surface. As a result, particles are apt to be removed.

Moreover, the three-fluid jet nozzle 300 is scanned by a scanning unit (not shown) along the surface in the direction of the outer peripheral part from the central part of the semiconductor wafer 100 together with jet of the gas 308 and the droplet mist 307 which have been described above (SD: Scanning Direction). Scanning speed is, e.g., 0.01 to 0.05 m/sec. In accordance with the jet, scanning operation of three-fluid jet nozzle 300 and rotation of the semiconductor wafer 100, particles of the entirety of the surface of the semiconductor wafer 100 are removed.

As described above, in accordance with this embodiment, gas 308 can be first directly jetted onto the semiconductor wafer to thereby thin the stagnant layer 101. Accordingly, fine particles embedded within the stagnant layer 101 are exposed to increase the probability where droplet 103 and fine particle are caused to be in contact with each other. Accordingly, it is possible to efficiently remove fine particles.

In addition, since jet of gas 308 can be manipulated separately from jet of droplet mist 307, it is possible to jet droplet mist 307 and gas 308 without mixing them. Namely, since the droplet mist 307 and the gas 308 have different velocity vectors, it is difficult to accelerate droplet 103 included within droplet mist 307 by high speed gas 308. Accordingly, it is possible to thin the thickness of the stagnant layer 101 without applying excessive damage to fine pattern of the semiconductor wafer surface.

First Modified Example of the Fifth Embodiment

The first modified example of the fifth embodiment will now be described with reference to FIG. 13. This modified example differs from the fifth embodiment in that angle of the gas jet nozzle 602 can be freely adjusted.

Figure 13:
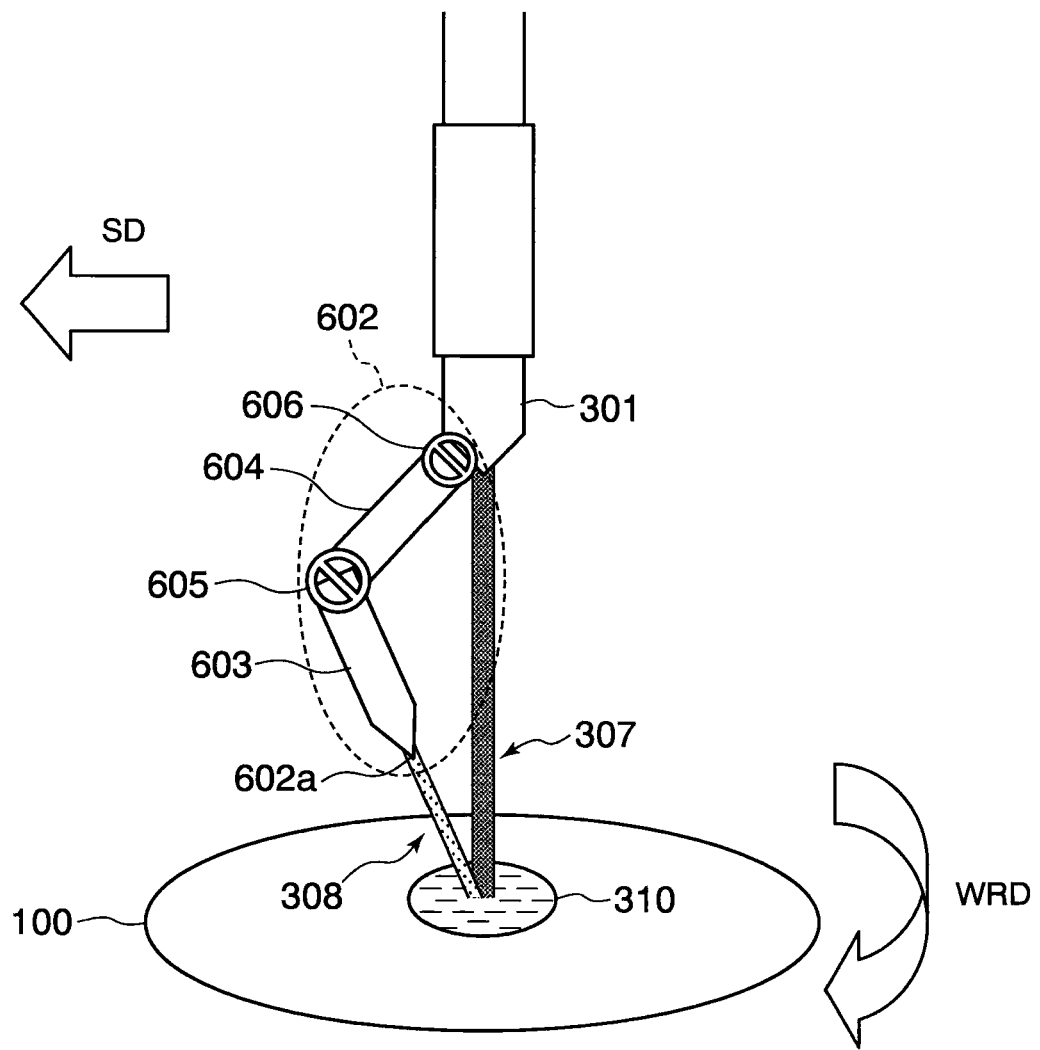
FIG. 13 is a conceptual diagram schematically representing the main part of a cleaning apparatus for a semiconductor wafer according to a first modified example of the fifth embodiment of the present invention.

As shown in FIG. 13, the gas jet nozzle 602 includes an adjustment screw 605 between hoses 603, 604, and includes an adjustment screw 606 between the hose 604 and the two-fluid jet nozzle 301. By such a configuration, the gas jet nozzle 602 can freely adjust direction of jet hole 602 of the front end by using adjustment screws 605, 606. Accordingly, it is possible to adjust jet direction of the gas 308.

In accordance with this embodiment, since jet angle of gas 308 can be freely adjusted, it is possible to freely control the thickness of stagnant layer 101 which has taken place within the area where droplet mist 307 is jetted. Accordingly, high speed gas 308 is jetted at a suitable angle, thus making it possible to maintain the thickness of the stagnant layer 101 to be thin.

Second Modified Example of the Fifth Embodiment

The second modified example of the fifth embodiment will now be described. In this modified example, angle of gas jet nozzle 302 is caused to be different from that of the fifth embodiment.

Namely, referring to FIG. 10, setting is made such that high speed gas 308 is jetted in correspondence with the scanning direction of the three-fluid jet nozzle 300 before droplet mist 307 is jetted. For example, if the scanning direction of the three-fluid jet nozzle 300 is a direction from right direction to left direction in FIG. 10, gas 308 is jetted in advance into the region of the left side of the region where droplet mist 307 is jetted. Since the three-fluid jet nozzle 300 is scanned, droplet 103 included within subsequently arriving droplet mist 307 collides with the region where gas 308 is jetted in advance so that the stagnant layer 101 has been thinned.

Accordingly, also in this modified example, since gas 308 jetted at a high speed during scanning operation thins the stagnant layer 101, the probability where the droplet 103 and the fine particle are in contact with each other can be increased. Accordingly, it is possible to efficiently remove particles.

Sixth Embodiment

The sixth embodiment of the present invention will now be described. This embodiment differs from the fifth embodiment in that cleaning processing is carried out while changing jet speed of the gas 308.

Namely, in this embodiment, in jetting gas 308 from oblique direction with an angle being changed by using the cleaning apparatus for a semiconductor wafer according to the fifth embodiment, the jet speed is changed into high speed or low speed in accordance with the size of pattern of surface of the semiconductor wafer 100. In concrete terms, at the portion where the size of the pattern is small (e.g., fine pattern having pattern width of about 40 nm or less), the jet speed of gas 308 is caused to be lower than that of the fifth embodiment. At the part where the size of the pattern is large, or the part where pattern does not exist so that the semiconductor wafer surface is planar, the jet speed is caused to be higher than that of the fifth embodiment.

Accordingly, in accordance with this embodiment, it is possible to suitably disperse stagnant layer 101 in accordance with pattern shape without damaging the fine pattern of the surface of the semiconductor wafer 100 thus to thin its thickness. Thus, droplet 103 included within the droplet mist 307 can be closer to the surface of the semiconductor wafer 100 thus to have ability to remove fine particles embedded within the stagnant layer 101.

Seventh Embodiment

The seventh embodiment of the present invention will now be described with reference to FIG. 14. This embodiment differs from the fifth embodiment in that there are provided two sets of gas jet nozzles 700, 701.

Figure 14:
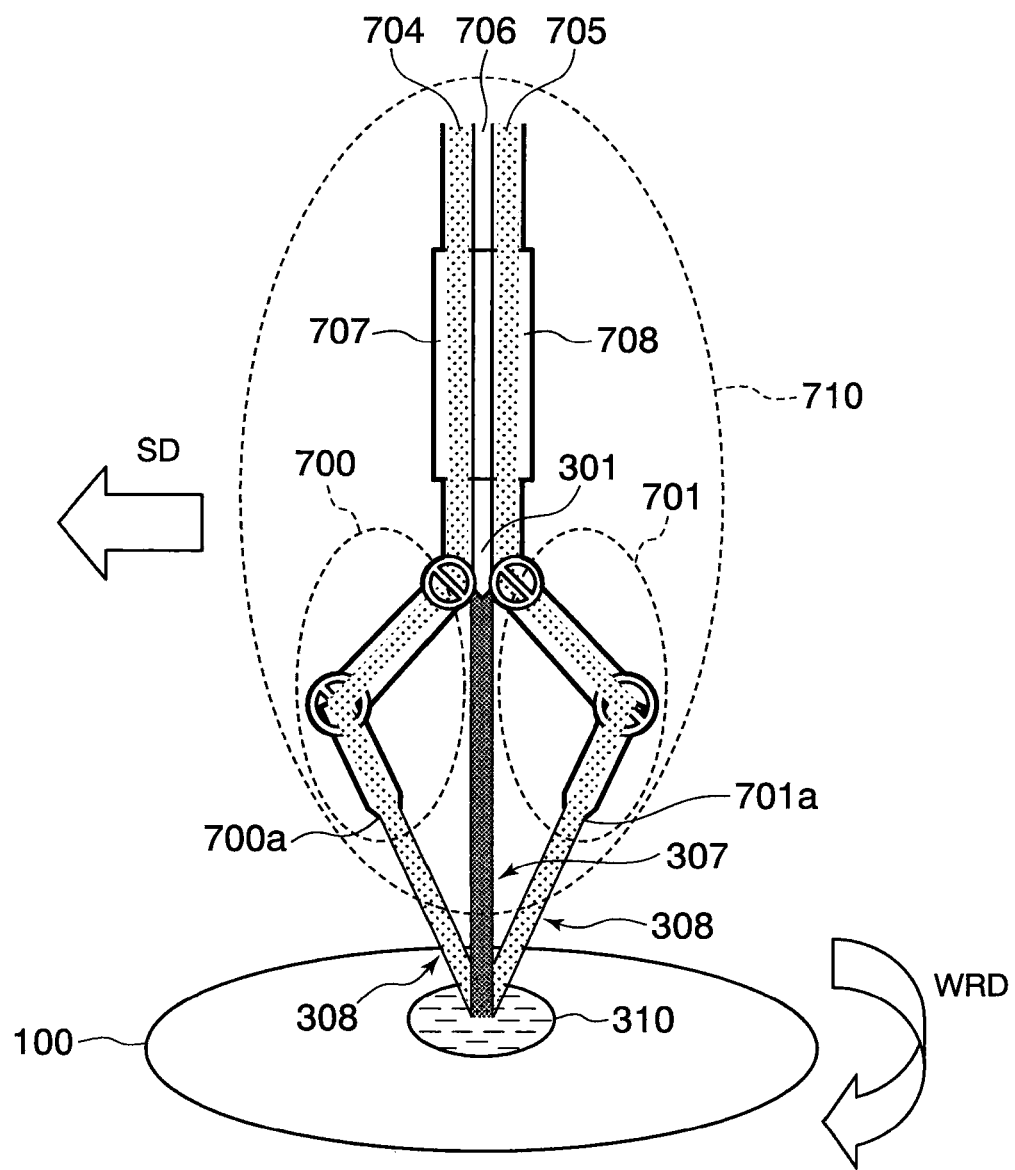
FIG. 14 is a conceptual diagram schematically representing the main part of a cleaning apparatus for a semiconductor wafer according to a seventh embodiment of the present invention.

Namely, as shown in FIG. 14, three-fluid jet nozzle 710 includes inlets 704, 705 for gas 308 and an inlet 706 for gas and liquid. Moreover, there is employed a structure such that penetrated two sets of gas passages 707, 708 are provided thus to communicate with respective jet holes 700a, 701a of two sets of gas jet nozzles 700, 701. By the configuration having two sets of gas jet nozzles 700, 701, it is possible to individually manipulate gas 308 and droplet mist 307 with degree of freedom higher than that of the fifth embodiment to jet them without performing mixing operation. Accordingly, it is possible to freely control the gas 308 and the droplet mist 307 in accordance with requirement of cleaning.

Eighth Embodiment

The eighth embodiment of the present invention will now be described with reference to FIG. 15.

This embodiment differs from the fifth embodiment in that the two-fluid jet nozzle and the gas jet nozzle are constituted as integral type nozzle (three-fluid jet nozzle).

Figure 15:
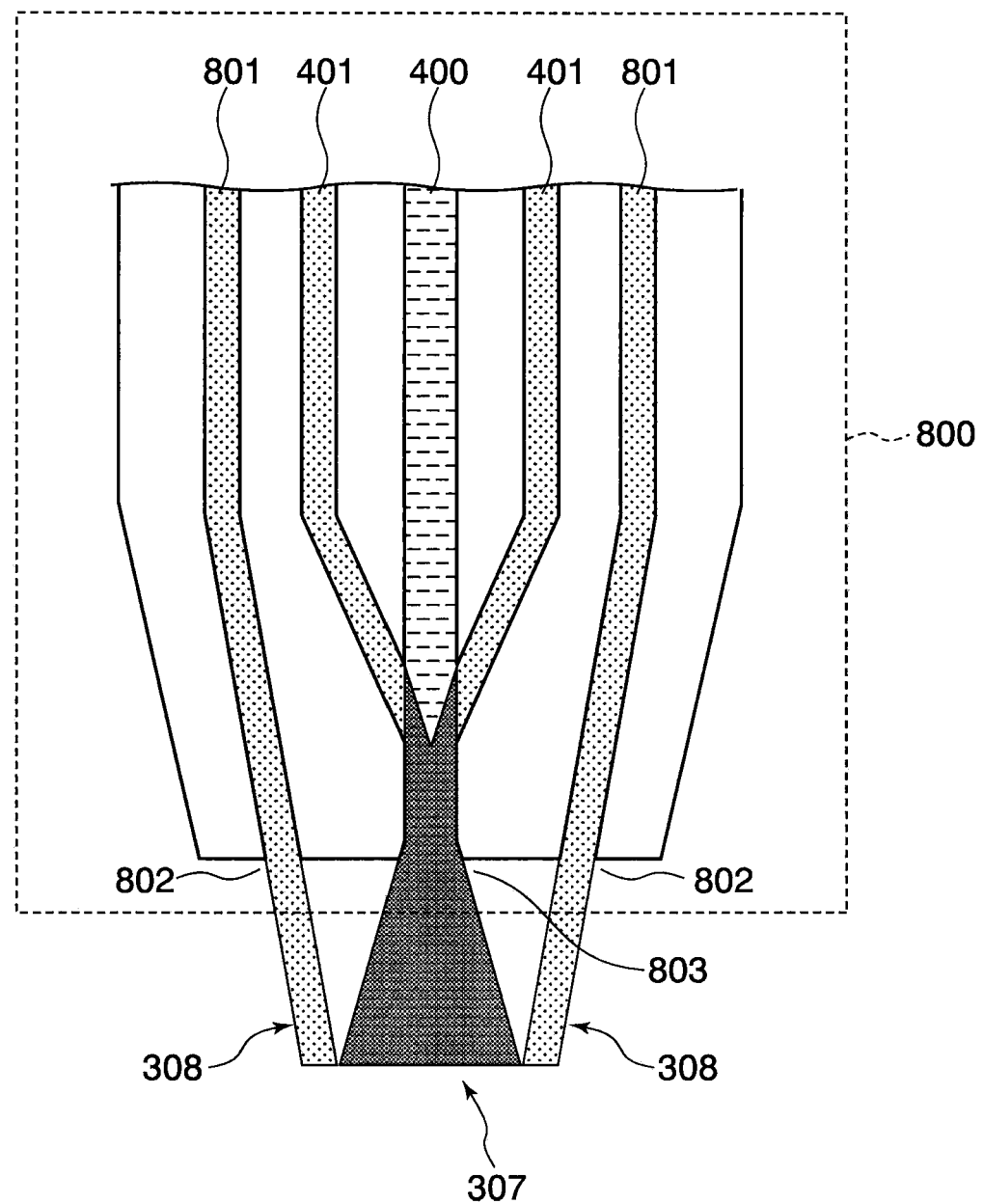
FIG. 15 is a conceptual diagram schematically representing the main part of a cleaning apparatus for a semiconductor wafer according to an eighth embodiment of the present invention.

FIG. 15 represents a cross sectional diagram of the three-fluid jet nozzle according to this embodiment. As shown in FIG. 15, this three-fluid jet nozzle 800 includes a two-fluid jet nozzle composed of a liquid passage 400 of the central part, and a gas passage 401 concentrically disposed in such a manner to surround the liquid passage 400; and a concentrical gas passage 801 disposed in a manner to surround the gas passage 401.

Liquid (e.g., deionized water, etc.) is supplied from the liquid passage 400, and gas (second gas: e.g., dry air or nitrogen, etc.) is supplied from the gas passage 401. Thus, droplet mist 307 is formed and is jetted onto the semiconductor wafer 100 from the jet hole 803. Moreover, high speed gas 308 (first gas; for example, dry air or inactive gas, such as, nitrogen, etc.) is delivered, and is jetted around the portion of the droplet mist 307 from the jet hole 802. Namely, the three-fluid jet nozzle 800 is configured to flow and jet the liquid, the first gas and the second gas.

Moreover, the three-fluid jet nozzle 800 is scanned in such a manner that droplet 103 included within droplet mist 307 collides with the region where the stagnant layer 101 is removed by pressure of gas 308 on the surface of the semiconductor wafer 100.

In accordance with this embodiment, since droplet mist 307 is jetted in the state where the stagnant layer 101 is maintained thin by high speed gas 308 similarly to the fifth embodiment, it is possible to effectively remove fine particles. Moreover, since jet speeds of the droplet mist 307 and the gas 308 can be individually manipulated, even if the jet speed of droplet mist 307 is maintained low and only the jet speed of gas 308 is caused to be high, the droplet mist 307 and gas 308 are not mixed. Accordingly, since the droplet 103 included in droplet mist 307 is not accelerated by gas 308, there is low possibility that damage is applied to fine pattern by droplet 103.

Moreover, in accordance with this embodiment, since the space occupied by the gas jet nozzle 302 of the fifth embodiment is unnecessary, process space can be reduced.

It should be noted that, in accordance with the fifth to eighth embodiments which have been described above, if the stagnant layer 101 is thinned, the above-described effects can be obtained irrespective of the rate of rotations of the semiconductor wafer 100, and scanning speeds of three-fluid jet nozzles 300, 710 and 800.

Moreover, in the fifth to eighth embodiments, cleaning liquid of the first embodiment may be used to form droplet mist 307. In this case, it is possible to efficiently remove particles as compared to the fifth to eighth embodiments.

Further, cleaning may be carried out by water-repellent semiconductor wafers which have been described in the second to forth embodiments. Also in this case, it is possible to efficiently remove particles as compared to the fifth to eighth embodiments.

It is to be noted that since there is the case where large droplets cannot be entered into corner portions of fine pattern in the above-described embodiments, it is preferable that droplet jetted by the two-fluid jet cleaning apparatus or the three-fluid jet cleaning apparatus has diameter of 5 μm or less.

Ninth Embodiment

The ninth embodiment of the present invention will now be described with reference to FIGS. 16 to 20. This embodiment differs from the first embodiment in that cleaning liquid in which chemical liquid for controlling zeta potential is mixed into dilute IPA aqueous solution is used as a cleaning liquid in the cleaning processing using single wafer cleaning apparatus.

In this specification, the zeta potential refers to a potential of the surface of particle in contact with cleaning liquid and potential of the surface of underlying film in contact with cleaning liquid.

Figure 16:
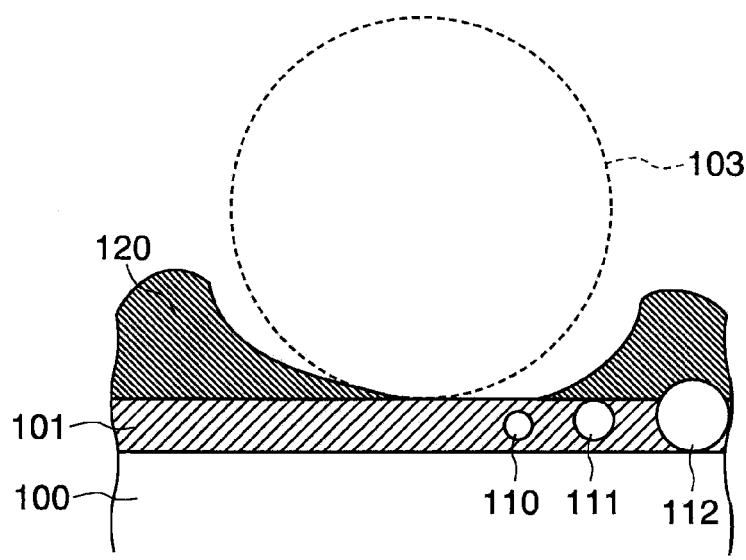
FIG. 16 is a schematic diagram indicating stagnant layer of water and particle on a semiconductor wafer.

FIG. 16 is a schematic diagram indicating stagnant layer of water and particle on the semiconductor wafer. As previously described, particles 110 to 112 are embedded within the stagnant layer 101 of water.

Figure 17:
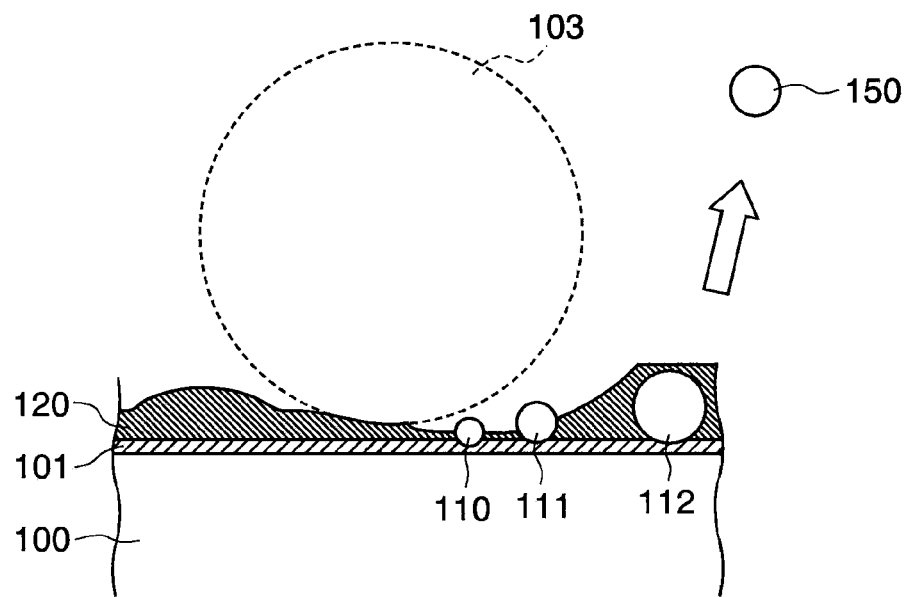
FIG. 17 is a schematic diagram indicating stagnant layer of dilute IPA aqueous solution and particle on a semiconductor wafer.

FIG. 17 is a schematic diagram indicating stagnant layer of dilute IPA aqueous solution and particles on the semiconductor wafer. As previously described, since the thickness of the stagnant layer 101 of the dilute IPA aqueous solution is thinner than that of water, the particles 110 to 112 are exposed to more degree as compared to the state of FIG. 16. For this reason, particles 110 to 112 are apt to be removed by force of wave that the droplet collision fluid layer 120 has. A particle 150 indicates a particle which has been separated and removed from the surface of the semiconductor wafer 100.

Figure 18:
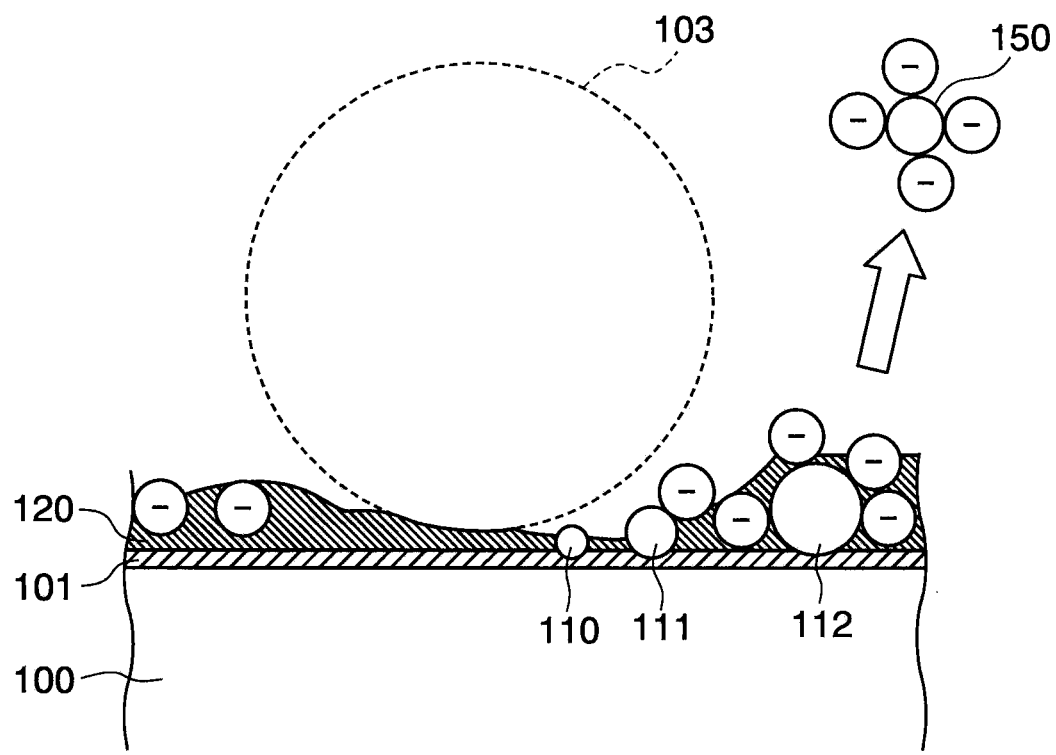
FIG. 18 is a conceptual diagram indicating the state of stagnant layer of chemical liquid in which additive agent for controlling zeta potential is added to dilute IPA aqueous solution and particle according to a ninth embodiment of the present invention.

FIG. 18 is a schematic diagram indicating the state of the stagnant layer of chemical liquid in which additive agent for controlling zeta potential is added to dilute IPA aqueous solution and particles. As additive agent thereof, there is used alkaline chemical liquid or surface active agent for controlling zeta potential. For example, as alkaline chemical liquid, ammonium hydroxide ($NH_4OH$) or choline, etc. may be used. Thus, control is made such that zeta potential is negative. Since the particle 150 desorbed from the semiconductor wafer 100 has negative zeta potential, such particle 150 is not attached again to the fluid layer 120 having negative zeta potential.

Figure 19A:
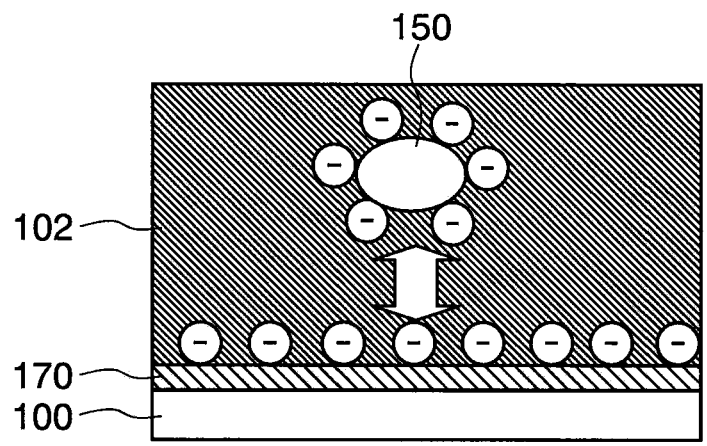
FIG. 19A is a conceptual diagram indicating repulsive force exerted on particle in the case where zeta potential is controlled according to the ninth embodiment of the present invention.
Figure 19B:
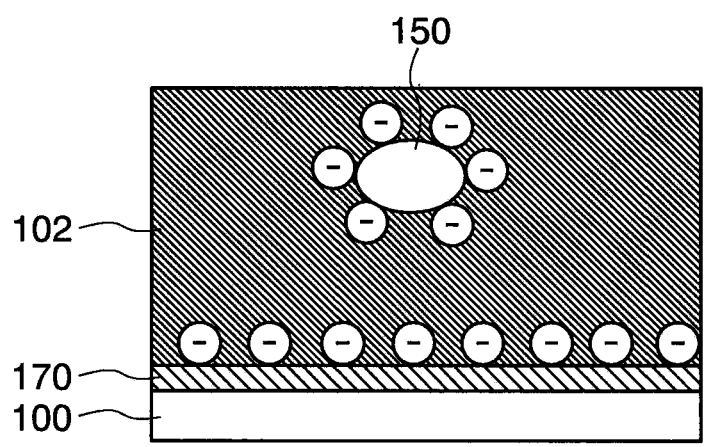
FIG. 19B is a conceptual diagram indicating the behavior of particle in the case where zeta potential is controlled according to the ninth embodiment of the present invention.

FIGS. 19A and 19B are schematic diagrams indicating the behavior of particle in the case where zeta potential is controlled. When zeta potential of particle 150 and zeta potential of underlying film 170 on the semiconductor wafer 100 are controlled as shown in FIG. 19A so that there is provided negative potential, repulsive force is exerted therebetween. As a result, as shown in FIG. 19B, particle 150 is dispersed into water flow layer 102, and is drained toward the outside of the bath. This phenomenon is based on zeta potential effect. This zeta potential does not depend upon the diameter of the particle 150. In addition, this zeta potential can be measured by the electrophoresis method.

Figure 20:
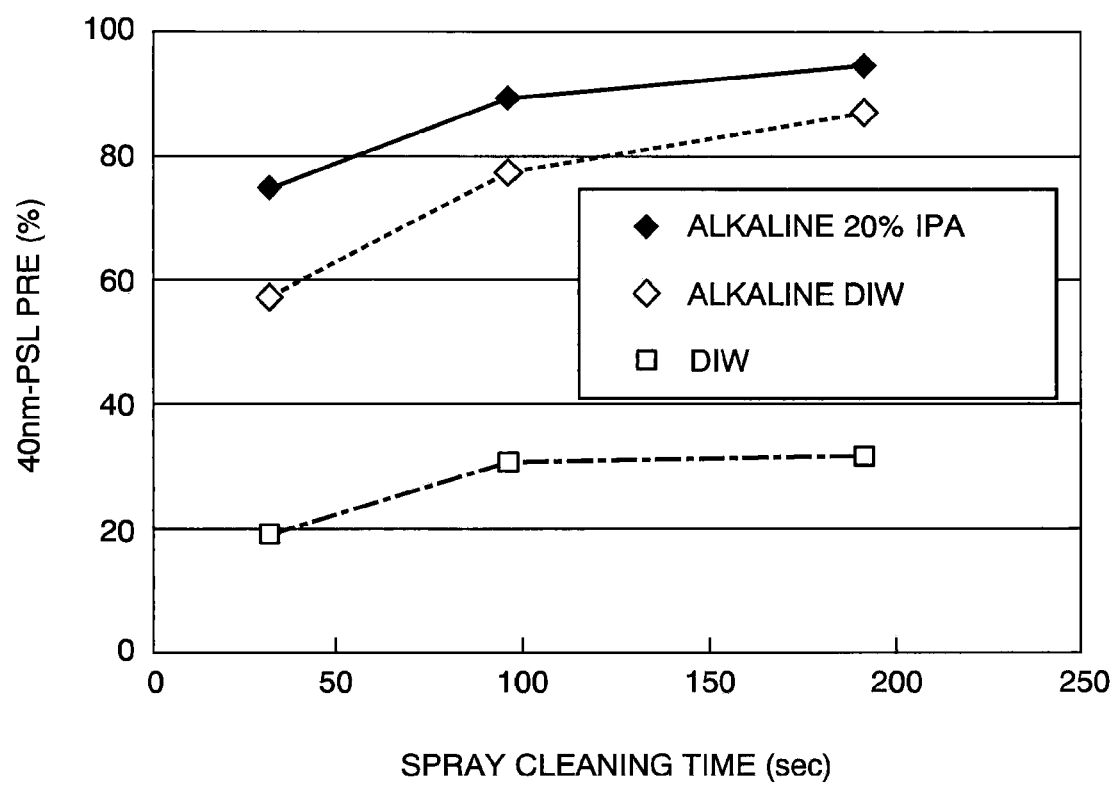
FIG. 20 is a diagram indicating particle removal efficiency in the case where two-fluid jet cleaning is carried out by using cleaning liquid in which alkaline chemical liquid is added to control zeta potential according to the ninth embodiment of the present invention.
Figure 21:
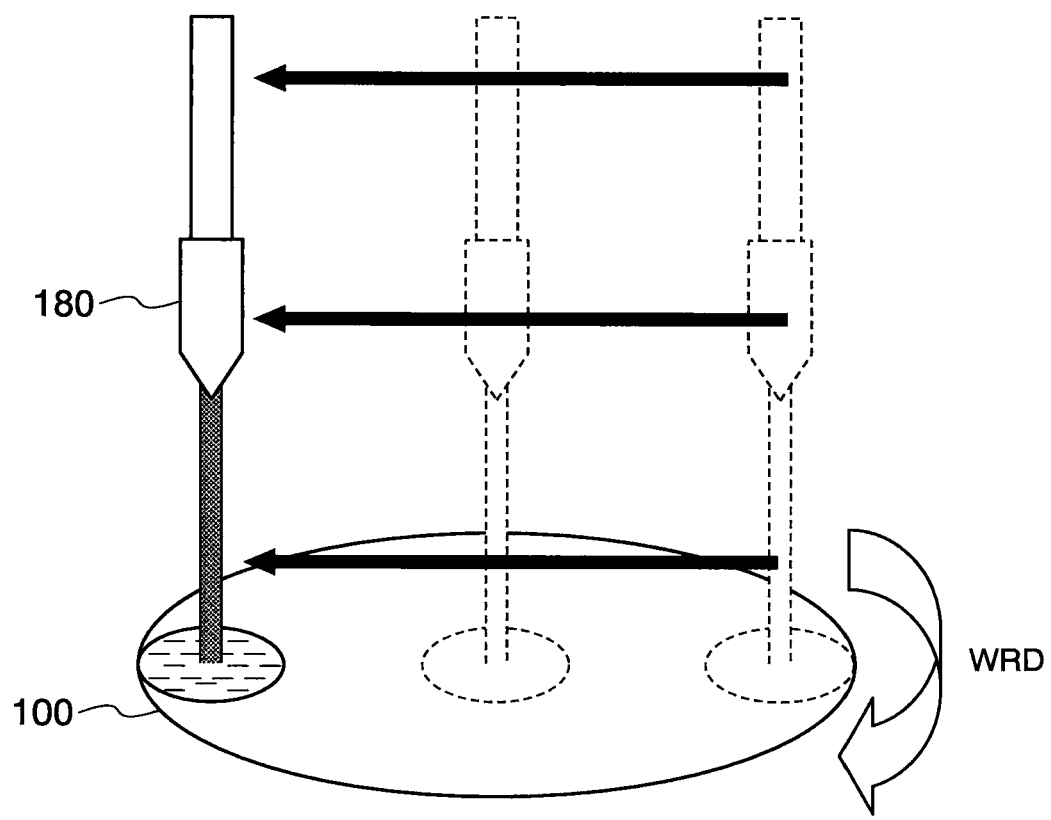
FIG. 21 is a schematic diagram indicating the locus of nozzle for discharging chemical liquid onto a semiconductor wafer according to the embodiment of the present invention.

Particle removal efficiency in the case where two-fluid jet cleaning is carried out by using cleaning liquid in which alkaline chemical liquid is added to control zeta potential is shown in FIG. 20. It is found out that removal efficiency of particle having a height of 40 nm is improved as compared to the case of the two-fluid jet cleaning using deionized water in which alkaline chemical liquid is not added. Moreover, also as compared to the two-fluid jet cleaning using dilute IPA aqueous solution described in the first embodiment, it becomes possible to efficiently remove fine particles in shorter time.

As described above, in accordance with this embodiment, after micro particle 150 having a height of about 40 nm is desorbed from the semiconductor wafer 100, particle 150 can be removed without being attached to the semiconductor wafer 100 again.

It is to be noted that there may be employed an approach to use, as cleaning liquid, HFE, which is described in the first embodiment, solution in which a very small amount of IPA is added into HFE, water in which surface active agent is mixed, etc. to mix alkaline chemical liquid for controlling the previously described zeta potential into the cleaning liquid. Moreover, there may be employed an approach to mix surface active agent for controlling zeta potential into HFE or solution in which a very small amount of IPA is added into HFE. As a surface active agent to be mixed, there may be employed one kind of surface active agent having both the effect to allow the substrate surface to be hydrophobic and the effect to control zeta potential. In addition, plural kinds of surface active agents having the above-described respective effects may be mixed. Namely, implementation may be carried out in the state changed as occasion demands depending upon circumstances.

Moreover, there may be used acid cleaning liquid in which acid chemical liquid is mixed into IPA, HFE or solution in which a very small amount of IPA is added into HFE. In that case, as chemical liquid for controlling zeta potential, surface active agent, etc. may be mixed.

Further, cleaning may be carried out by using a water repellent semiconductor wafer which has been described in the third and fourth embodiments. In this case, it is possible to more efficiently remove particles.

In addition, droplet mist 307 may be formed by using cleaning liquid of this embodiment also in the fifth to eighth embodiments. In this case, it is possible to more efficiently remove particles.

It should be noted that there may be employed, in the above-described first to ninth embodiments, an approach to scan the nozzle 180 along the surface in a diameter direction of the semiconductor wafer 100 to carry out discharge operation of chemical liquid onto the semiconductor wafer 100 by single scanning operation. Thus, since cleaning liquid after cleaning is immediately drained similarly to the case where scanning operation is carried out from the central part toward the direction of the outer peripheral part, it is possible to prevent removed particle from being attached to the semiconductor wafer 100 again.

While the embodiments of the present invention have been described above in detail, practical configurations are not limited to the above-described embodiments, but the present invention may be implemented in variously modified forms within the scope which does not depart from the gist of the present invention.

For example, the single wafer cleaning apparatus is not limited to the two-fluid jet cleaning apparatus or the three-fluid jet cleaning apparatus.

Moreover, while explanation has been given on the assumption that a semiconductor wafer subject to cleaning is such that pattern of elements is formed on the surface thereof, any surface state may be employed. For example, flat surface may be also employed.

Further, cleaning apparatus for a semiconductor wafer and cleaning method for a semiconductor wafer according to the embodiments of the present invention may be also used for cleaning of substrate other than a semiconductor wafer such as glass substrate of liquid crystal display device, etc.

Furthermore, there may be employed an approach to thin the stagnant layer thereafter to apply force to fine particles by methods other than the two-fluid jet cleaning to remove those fine particles.

In addition, droplet mist produced at the outside of the two-fluid jet nozzle may be supplied to the two-fluid jet nozzle.

The invention claimed is:

1. A cleaning apparatus for a semiconductor wafer, comprising:
   a three-fluid jet nozzle, comprising:
   a gas jet device including a gas nozzle which jets a first gas onto a surface of a semiconductor wafer;
   a two-fluid jet device including a two-fluid nozzle which jets droplet mist onto the surface of the semiconductor wafer, the droplet mist being mixed two-fluid of a liquid and a second gas; and
   a conduit including a first inlet in communication with the gas nozzle and a second inlet in communication with the two-fluid nozzle,
   the first and second inlets both provided at an upper part of the three-fluid jet nozzle, the liquid and the second gas passing through the second inlet.

2. The cleaning apparatus for a semiconductor wafer according to claim 1, further comprising:
   a holding unit which holds and rotates the semiconductor wafer; and
   a scanning unit having the two-fluid nozzle and the gas nozzle, the scanning unit scanning the surface of the semiconductor wafer.

3. The cleaning apparatus for a semiconductor wafer according to claim 2, wherein the scanning unit is configured to scan from a central part to an outer peripheral part of the semiconductor wafer.

4. The cleaning apparatus for a semiconductor wafer according to claim 1,
   wherein the two-fluid jet device is configured to jet the droplet mist in a direction substantially perpendicular to the surface of the semiconductor wafer, and
   the gas jet device is configured to jet the first gas, with a predetermined angle relative to vertical direction of the surface of the semiconductor wafer, toward the surface of the semiconductor wafer.

5. The cleaning apparatus for a semiconductor wafer according to claim 1,
   wherein the two-fluid nozzle and the gas nozzle are configured as an integral type nozzle, and
   the integral type nozzle is configured to jet the liquid, the first gas, and the second gas.

6. The cleaning apparatus for a semiconductor wafer according to claim 1,
wherein the gas jet device is configured to jet the first gas with a jet speed which is higher than a jet speed for the droplet mist.

7. The cleaning apparatus for a semiconductor wafer according to claim 1,
wherein the gas jet device is configured to vary a jet speed for the first gas.

8. The cleaning apparatus for a semiconductor wafer according to claim 1,
wherein the gas jet device comprises two sets of the gas nozzles.

9. The cleaning apparatus for a semiconductor wafer according to claim 1,
wherein the liquid is one of deionized water, isopropyl alcohol, hydrofluoroether, or water with a surface active agent, and
wherein the first gas and the second gas are dry air or nitrogen.

10. The cleaning apparatus for a semiconductor wafer according to claim 9,
wherein the liquid comprises a chemical liquid or a surface active agent, the chemical liquid or the surface active agent controlling both zeta potential of the semiconductor wafer and zeta potential of particle on the semiconductor wafer to be same potential.

11. The cleaning apparatus for a semiconductor wafer according to claim 1,
wherein the gas nozzle jets the first gas onto the surface of the semiconductor wafer to thin the thickness of a stagnant layer on the surface of the semiconductor wafer, and
the two-fluid nozzle jets the droplet mist onto a region where thickness of the stagnant layer of the semiconductor wafer is thinned.

12. A cleaning method for a semiconductor wafer using the cleaning apparatus for a semiconductor wafer according to claim 1, comprising:
making thickness of a stagnant layer of the liquid on the surface of the semiconductor wafer thinner than thickness of a stagnant layer of water by using the liquid, the liquid being included in the droplet mist jetted by the two-fluid nozzle, the liquid having a surface tension lower than that of water and having viscosity lower than that of water; and
cleaning the semiconductor wafer with the liquid.

13. The cleaning method for a semiconductor wafer according to claim 12,
wherein the liquid is one of isopropyl alcohol, hydrofluoroether, or water with a surface active agent.

14. The cleaning method for a semiconductor wafer according to claim 12,
wherein a diameter of the droplet mist is 5 μm or less.

15. The cleaning method for a semiconductor wafer according to claim 12,
wherein the liquid comprises a chemical liquid or a surface active agent, the chemical liquid and the surface active agent controlling zeta potential of the semiconductor wafer and zeta potential of particle on the semiconductor wafer to be same potential.

16. The cleaning method for a semiconductor wafer according to claim 15,
wherein the chemical liquid is ammonium hydroxide or choline.

17. The cleaning method for a semiconductor wafer according to claim 12,
the cleaning comprising:
jetting the liquid onto a predetermined region on the surface of the semiconductor wafer while rotating the semiconductor wafer; and
scanning the liquid jet position over the semiconductor wafer from a central part to an outer peripheral part of the semiconductor wafer.

18. The cleaning method for a semiconductor wafer according to claim 12,
the cleaning comprising:
jetting the first gas onto a predetermined region on the surface of the semiconductor wafer to thin thickness of the stagnant layer on the predetermined region; and
while jetting the first gas, jetting the droplet mist onto the predetermined region.

19. A cleaning method for a semiconductor wafer using the cleaning apparatus for a semiconductor wafer according to claim 1, comprising:
making the surface of the semiconductor wafer water-repellent so that a stagnant layer of the liquid is not formed on the surface of the semiconductor wafer; and
thereafter, cleaning the surface of the semiconductor wafer with the liquid.

20. The cleaning method for a semiconductor wafer according to claim 19,
wherein the water repelling action is carried out by using a silicon resin coating agent.

* * * * *